United States Patent
Levinski et al.

(10) Patent No.: US 9,841,689 B1
(45) Date of Patent: Dec. 12, 2017

(54) APPROACH FOR MODEL CALIBRATION USED FOR FOCUS AND DOSE MEASUREMENT

(71) Applicant: KLA-TENCOR CORPORATION, Milpitas, CA (US)

(72) Inventors: Vladimir Levinski, Migdal HaEmek (IL); Daniel Kandel, Aseret (IL); Yoel Feler, Haifa (IL); Nadav Gutman, Zichron Ya'agov (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/832,750

(22) Filed: Aug. 21, 2015

Related U.S. Application Data

(60) Provisional application No. 62/040,907, filed on Aug. 22, 2014.

(51) Int. Cl.
*G02B 27/52* (2006.01)
*G03F 7/20* (2006.01)

(52) U.S. Cl.
CPC ...... *G03F 7/70641* (2013.01); *G03F 7/70283* (2013.01)

(58) Field of Classification Search
CPC .......................... G03F 7/70283; G03F 7/70641
USPC ........................ 355/52, 55, 67, 77
See application file for complete search history.

(56) References Cited

U.S. PATENT DOCUMENTS

| | | |
|---|---|---|
| 7,273,685 B2 | 9/2007 | Sasazawa et al. |
| 2004/0190008 A1* | 9/2004 | Mieher ............... G01N 21/956 356/625 |
| 2010/0162197 A1 | 6/2010 | Ye et al. |
| 2012/0013875 A1 | 1/2012 | Geraets et al. |
| 2013/0217154 A1* | 8/2013 | Fukazawa ............. G03F 9/7026 438/7 |
| 2014/0141536 A1 | 5/2014 | Levinski et al. |
| 2014/0315330 A1* | 10/2014 | Fujimori ............. G03F 7/70641 438/7 |
| 2015/0042984 A1* | 2/2015 | Pandev ............... G03F 7/70641 356/124 |

FOREIGN PATENT DOCUMENTS

| | | |
|---|---|---|
| EP | 1688795 A2 | 8/2006 |
| EP | 1881374 A2 | 1/2008 |
| EP | 1416330 B1 | 7/2009 |
| WO | 2014082938 A1 | 6/2014 |

OTHER PUBLICATIONS

Martin Ebert et al., Combined Overlay, Focus and CD Metrology for Leading Edge Lithography; Optical Microlithography XXIV, edited by Mircea V. Dusa, Proc. of SPIE vol. 7973, 797311—@2011 SPIE.

* cited by examiner

*Primary Examiner* — Hung Henry Nguyen
(74) *Attorney, Agent, or Firm* — Suiter Swantz pc llo

(57) ABSTRACT

A method is provided that comprises printing FEM wafers having different predefined focus offsets and multiple corresponding sites, measuring signals from the sites, and quantifying a focus inaccuracy by comparing the measured signals from the corresponding sites across the wafers.

17 Claims, 4 Drawing Sheets

APPROACH FOR MODEL CALIBRATION USED FOR FOCUS AND DOSE MEASUREMENT

CROSS REFERENCE TO RELATED APPLICATIONS

This application claims the benefit under 35 U.S.C. §119(e) of U.S. Provisional Patent Application No. 62/040,907 filed on Aug. 22, 2014, which application is incorporated herein by reference in its entirety.

FIELD OF THE INVENTION

The present invention relates to the field of metrology, and more particularly, to measuring and correcting focus inaccuracy.

BACKGROUND OF THE INVENTION

Lithographic printing tools (e.g. scanners, steppers, etc. and referred to henceforth as "a scanner") need to maintain their focus and dose values within some node-defined process window. Consequently, there are strict requirements on both focus and dose as scanner parameters. For recent nodes, the allowed range of focus variations is +10 nm around its nominal position and this requirement will become tougher for the next nodes. A general approach for determining the actual scanner's focus position consists of printing of a special target, which is sensitive to focus changes of the scanner on product wafers and measuring some corresponding property (or properties) of the printed pattern. The dose is measured in the same way. The relation between the measured properties and the scanner focus and/or dose is established using a special test wafer (FEM—focus exposure matrix wafer), in which the same pattern is printed for different predefined scanner focus and dose values.

Currently, models are generated and calibrated on the basis of standard FEM, in which predefined focus positions change along one direction (e.g., X) while predefined dose values change along the perpendicular direction (e.g., Y). Hence, successful model creation, which is based on FEM wafer usage together with designing of targets having high sensitivity to scanner focus changes, is the most important component of focus and dose measurement approach. However, since the scanner focus errors due to process variations on product wafer are about 20 nm, the same focus errors should be expected on FEM wafers. Such a large ambiguity in scanner focus positions on FEM wafers does not allow the generation of sufficiently finely calibrated models and may cause large errors in subsequent focus/dose measurements. In order to reduce correlation between focus/dose characteristics and process variations, a random FEM is used. In this case, the sites corresponding to different values of focus and dose are randomly placed in a wafer area.

BRIEF SUMMARY OF THE INVENTION

The following is a simplified summary providing an initial understanding of the invention. The summary does not necessarily identify key elements nor limit the scope of the invention, but merely serves as an introduction to the following description.

One aspect of the present invention provides a method comprising printing a plurality of wafers having different predefined focus offsets, the wafers having a plurality of corresponding sites, measuring signals from the sites, and quantifying a focus inaccuracy by comparing the measured signals from the corresponding sites across the wafers.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
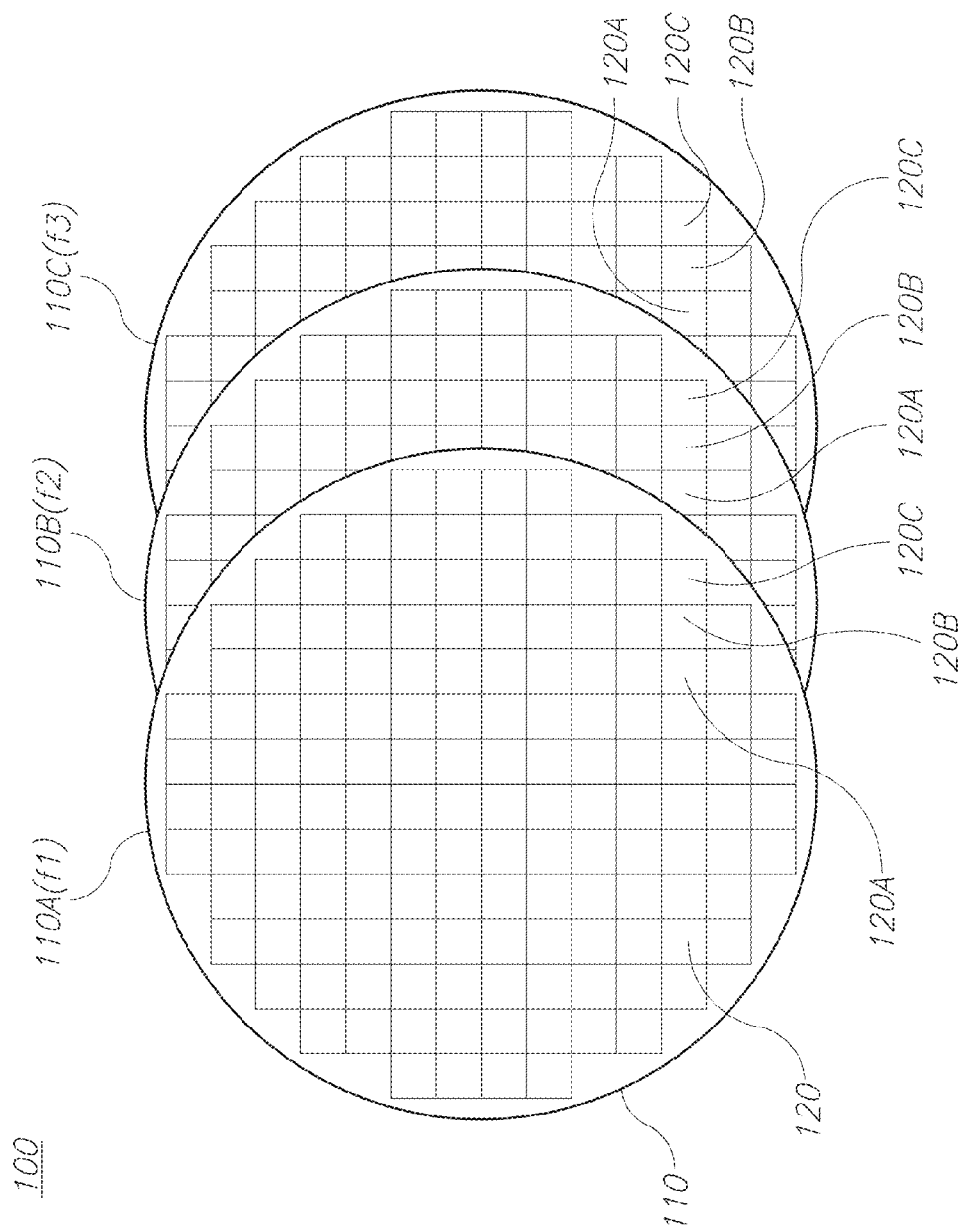
FIG. 1 is a high level schematic illustration of a set of FEM wafers having different predefined focus offsets, according to some embodiments of the invention.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

A method is provided that comprises printing FEM wafers having different predefined focus offsets and multiple corresponding sites, measuring signals from the sites, and quantifying a focus inaccuracy by comparing the measured signals from the corresponding sites across the wafers.

Disclosed methods overcome the main disadvantage of current model calibration approaches based on FEM wafer, namely that they do not solve the problem of scanner focus position ambiguities caused by different process variations on different sites of FEM wafer, and hence do not allow creation of a model that enables measuring focus positions with accuracy better than 4-5 nm. Specifically, the regular FEM approach suffers both from focus ambiguity (caused by process variations) and from the direct effect of process variations on the measured signals. Since the larger part of process variations on the wafer has a systematic character and since focus\dose changes have systematic character, the model calibrated on such FEM wafer provides large systematic errors in focus\dose measurements. The random FEM approach reduces the effect of scanner focus ambiguities by making them non-systematic, providing some averaging effect when the model is created. However, the random FEM approach requires about one hundred random FEM wafers in order to reduce this effect by an order of magnitude (required for achieving an accuracy budget for focus measurement that is better than 4-5 nm, as wafers are needed with different placement of sites corresponding to the same predefined values of focus and dose).

Embodiments of the present invention provide a new pre-calibration approach that allows a reduction of ambiguity in the scanner focus positions on FEM wafer by order of magnitude to below 2-3 nm.

FIG. 1 is a high level schematic illustration of a set 100 of FEM wafers 110 having different predefined focus offsets, according to some embodiments of the invention.

Certain embodiments comprise using set 100 of nominal wafers 110 (e.g., wafers 110A-C) with different predefined focus offsets (e.g., $f_1$, $f_2$, $f_3$). This concept is based on the assumption that the difference in process variations between different sites 120 (e.g., sites 120A-C) on a single wafer is much larger than the difference between process variations corresponding to the same sites on set 100 of wafers 110 (e.g., wafers 110A-C) from the same lot. This assumption is supported by the fact that most process variations on the wafer have a very systematic character which is replicated from wafer to wafer at least within one lot.

Several nominal wafers 110 (e.g., three or more wafers) may be printed to have different predefined focus offsets (e.g., a set of wafers 110 having predefined focus offsets {f}=[−30 nm, −20 nm, −10 mn, 0 nm, 10 nm, 20 nm, 30 nm]). Signals S (e.g., pixel, site, focus offset) may then be measured and analyzed with respect to site 120 across set 100 of wafers 110.

Figure 2A:
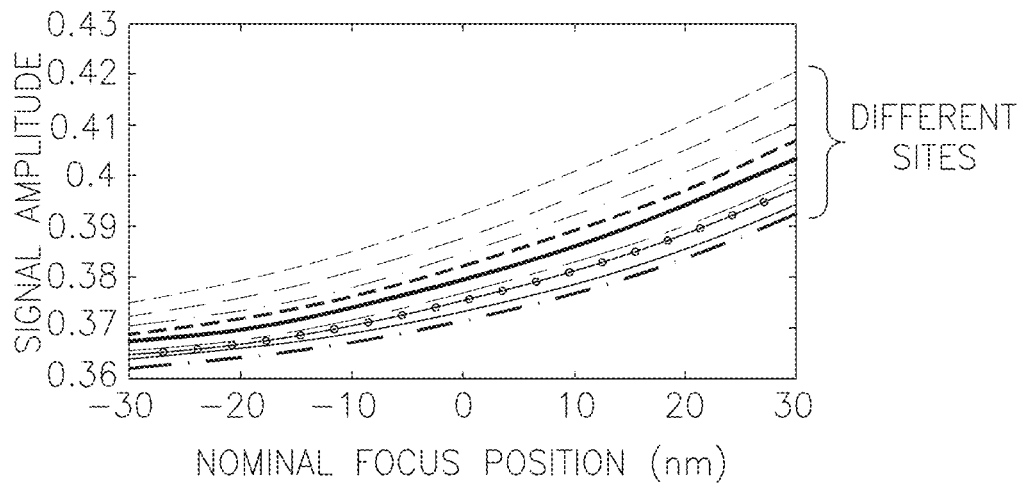
FIG. 2A is an illustration of the result of signal analysis with respect to the predefined focus offsets across sites, according to some embodiments of the invention.
Figure 2B:
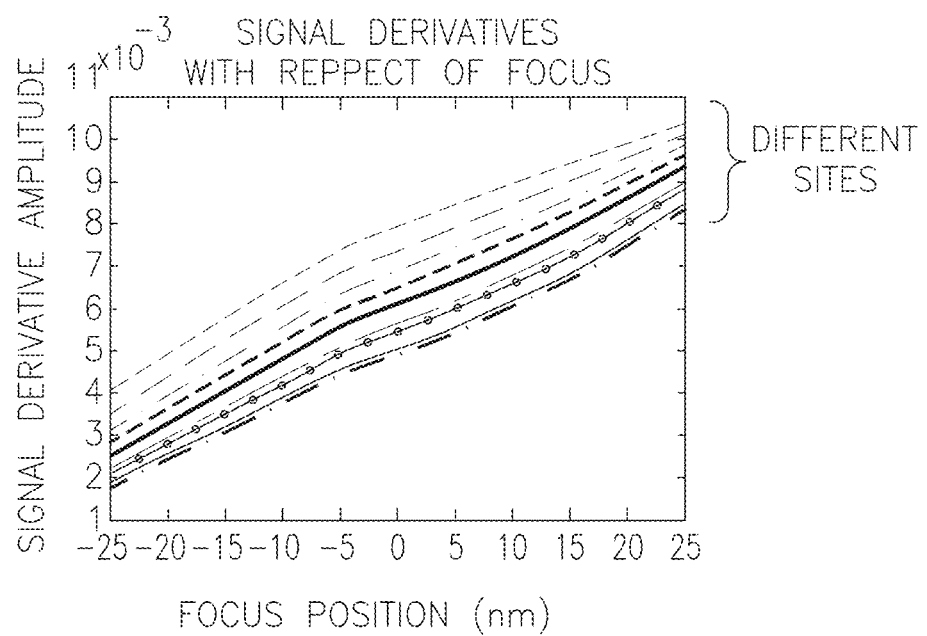
FIG. 2B is an illustration of the result of signal analysis with respect to the predefined focus offsets across sites, according to some embodiments of the invention.

FIGS. 2A and 2B exemplify schematically results of signal analysis with respect to the predefined focus offsets across sites 120, according to some embodiments of the invention. The illustrated diagram presents the signal amplitude at a certain pixel on a CCD camera for several sites (different lines) as a function of the different predefined focus positions f. The results may be approximated by a plurality of calibration curves corresponding to different sites 120 and may be understood to express, for instance, focus shifts due to printing tool focus errors and signal bias (as the effect of process variations is mostly additive, the variability of the process variation with respect to the changes in focus may be neglected to the leading order). Thus, the calibration curves for all targets at different sites 120 may be superposed to yield actual focus offsets between different sites 120 and correct focus values on FEM wafer 110 (up to a focus shift common for all sites).

The suggested approach may be used as a new model-less approach for focus measurement. The requirement to print several wafers 110 with predefined focus offsets between them may not be implemented on product wafers as in the prior art, but it may be used for calibration purpose together with printing FEM wafer.

Any algorithm may be used to measure and compare focus offsets between sites 120. As a non-limiting example, the signals shown in FIG. 2A may be approximated to the leading order parabolically as in Equation 1:

$$P(f|f_0) = a \cdot (f-f_0)^2 + b \cdot (f-f_0) + c \qquad \text{(Equation 1)}$$

with $f_0$ corresponding to the focus shift due to printing tool error on a specific site, coefficients a and b being the same for all sites 120 whereas coefficient c denotes the bias that is different for each site 120 and includes the contribution of focus variations. In order to exclude the direct effect of process variations, the derivative of the signals with respect to focus may be first calculated by subtracting the signals corresponding to nominal wafer number n from the signals corresponding to the consecutive nominal wafer number n+1 and dividing the difference by the value of the different in focus shift between wafers n and n+1. FIG. 2B schematically illustrates examples for signal derivatives calculated using this principle (data for one pixel as in FIG. 2B, different lines represent different sites).

Using, in a non-limiting manner, Equation 1, the signal derivative (P'=dP/df) is expressed in Equation 2:

$$P_f' = 2af - 2af_0 + b \qquad \text{(Equation 2)}$$

Using analysis data as those presented in FIG. 2B, the coefficient 2a of Equation 2 may be measured as the slope of the lines, averaged over all sites (lines). The differences D between lines corresponding to different sites, averaged over all focus positions may be expressed as in Equation 3:

$$D_{i,j} = -2a(f_0^i - f_0^j) \qquad \text{(Equation 3)}$$

with indices i and j designate different sites 120. The difference D between lines corresponding to different sites divided by the measured coefficient 2a then yields the correct focus offset between two sites ($D_{i,j}/2a$). This value is exactly the printing tool focus error due to process variations, so knowing this error for each one of sites (relative to the chosen one, for example the site in the center of the wafer) provides correct focus positions on the FEM wafer.

Figure 3:
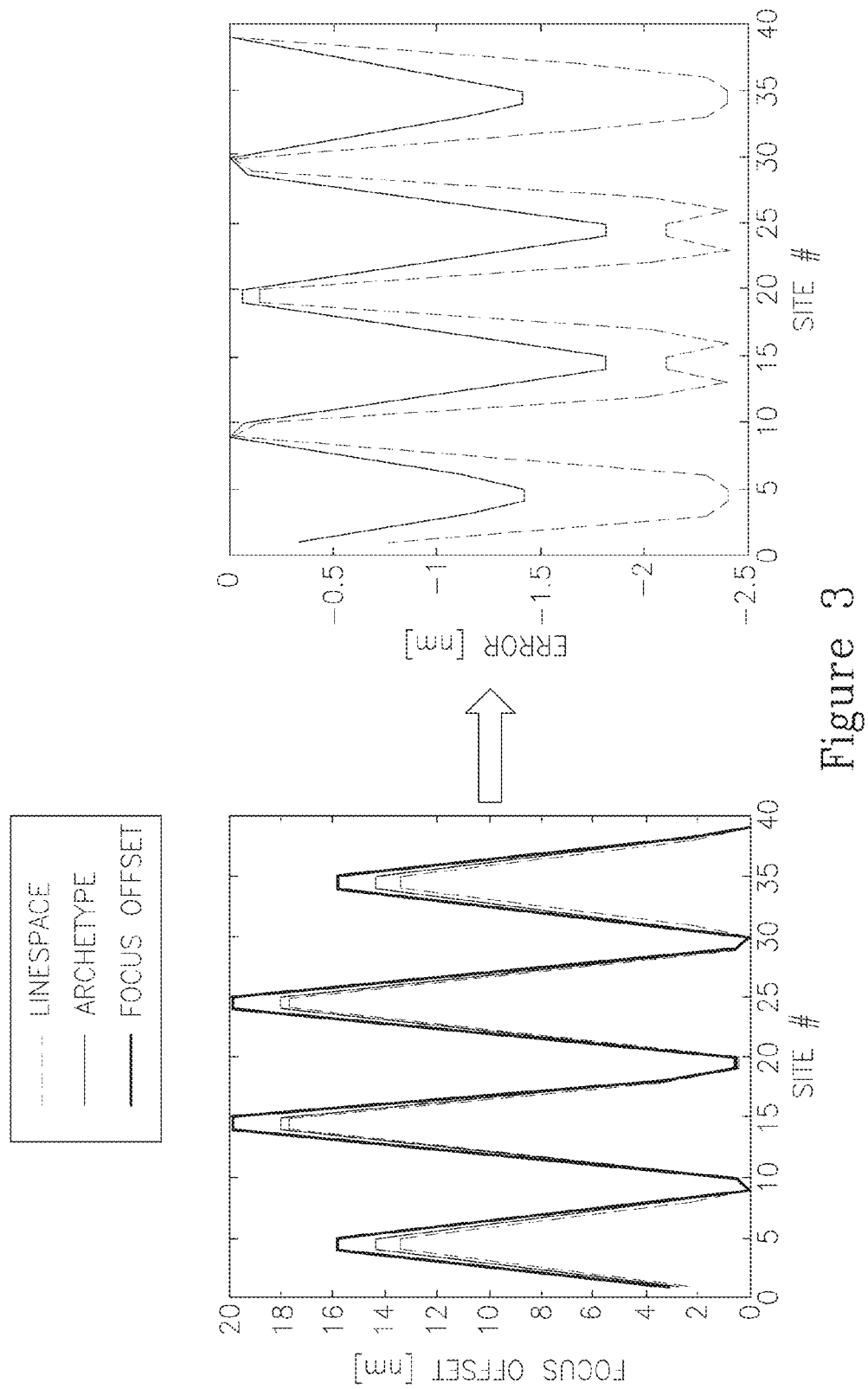
FIG. 3 is an illustration of simulation results showing removal of artificially introduced systematic focus errors, according to some embodiments of the invention; and, FIG. 4 is a high level flowchart illustrating a method, according to some embodiments of the invention.

FIG. 3 schematically illustrates simulation results of removal of artificially introduced systematic focus errors, according to some embodiments of the invention. The left side of FIG. 3 illustrates offset measurements with artificially introduced systematic focus errors for a range of sites 120, while the right side of FIG. 3 illustrates the accuracy budget upon application of the disclosed correction of the focus error. Specifically, the thick line in the left-hand diagram shows the error in focus position due to scanner on each specific site 120. The broken line and the thin line in both the left-hand and right-hand diagrams show the predicted errors (using FEM wafers 110 with predefined focus offsets as disclosed above) for archetypes and for line-space targets (the latter are less sensitive to focus). Thus the difference between the thick line and either of the thin and broken lines indicates the unpredicted errors at each site 120. The right hand diagram illustrates these errors. It is noted that the error for archetypes is smaller than the error for the line-space targets, since the archetypes have a better sensitivity to focus. The results demonstrate a reduction of focus position error by more than order of magnitude.

Figure 4:
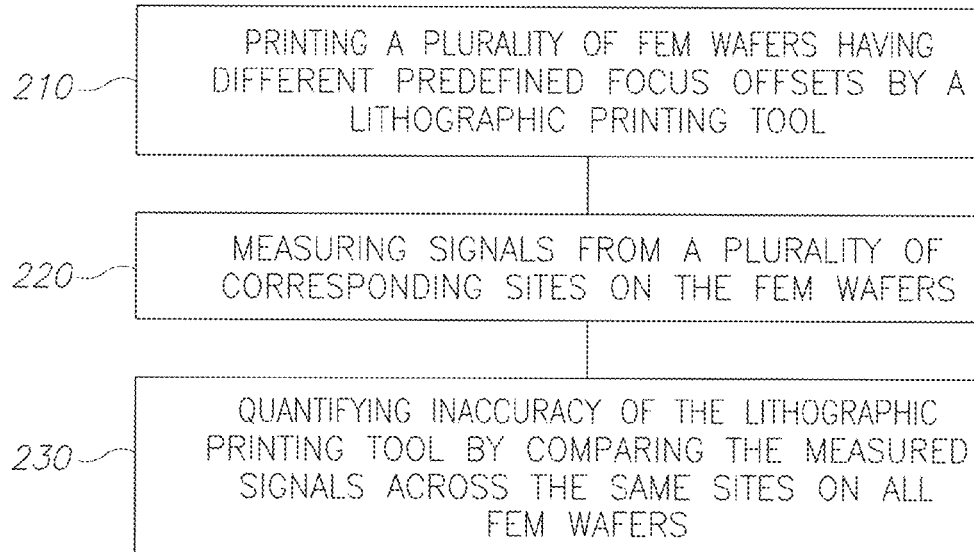

FIG. 4 is a high level flowchart illustrating a method 200, according to some embodiments of the invention. Method 200 may be at least partially implemented by at least one computer processor (e.g., in a metrology module). Certain embodiments comprise computer program products comprising a computer readable storage medium having a computer readable program embodied therewith and configured to carry out any of the relevant stages of method 200 (e.g., to quantify a focus inaccuracy by comparing measured signals from corresponding sites across a plurality of wafers having different predefined focus offsets).

Method 200 may comprise printing a plurality of wafers having different predefined focus offsets (stage 210), with the wafers having a plurality of corresponding sites, measuring signals from the sites (stage 220), and quantifying a focus inaccuracy by comparing the measured signals from the corresponding sites across the wafers (stage 230) (e.g., by deriving the focus inaccuracy by dividing an average difference between sites by a slope of a derivative of the signal measurements with respect to the designed focused offsets). The wafers may be FEM wafers with typical designs and targets and the focus inaccuracy may relate to the printing lithography tool (e.g., a scanner, a stepper, etc.). Quantifying 230 may be of any measure of inaccuracy of the lithographic printing tool, derived by comparing the measured signals across the same sites on all FEM wafers.

Certain embodiments comprise a plurality of metrology signals, measured from corresponding sites across a plurality of wafers having different predefined focus offsets. Certain embodiments comprise a plurality of FEM wafers having different predefined focus offsets.

Embodiments of the disclosed approach allow for correcting focus position ambiguities on FEM wafers, which is required for creating a consistent model for focus and dose measurement. A set of nominal wafers with predefined focus offsets may be used for measurement focus position ambiguities on the FEM wafer.

Embodiments may be implemented on any metrology platform, for use in focus and dose control. This approach can be combined with any type of focus\dose measurement based on line space targets and/or on special focus offset targets, with any tool and corresponding algorithm. Generally, the measurement of focus position ambiguities is a necessary step which should forestall creating a model on the FEM wafer and subsequent focus and dose measurement.

In the above description, an embodiment is an example or implementation of the invention. The various appearances of "one embodiment", "an embodiment", "certain embodiments" or "some embodiments" do not necessarily all refer to the same embodiments.

Although various features of the invention may be described in the context of a single embodiment, the features may also be provided separately or in any suitable combination. Conversely, although the invention may be described herein in the context of separate embodiments for clarity, the invention may also be implemented in a single embodiment.

Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone.

Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described.

Meanings of technical and scientific terms used herein are to be commonly understood as by one of ordinary skill in the art to which the invention belongs, unless otherwise defined.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method comprising:
receiving a plurality of wafers including different predefined focus offsets, the plurality of wafers including a plurality of corresponding sites, the plurality of corresponding sites printed on the plurality of wafers with a lithographic printing tool;
acquiring a plurality of measurements for the plurality of corresponding sites across the plurality of wafers; and
quantifying, with one or more processors, a focus inaccuracy by comparing the plurality of measurements for the plurality of corresponding sites across the plurality of wafers, wherein the comparing the plurality of measurements includes determining a focus position difference between a set of measurements of the plurality of measurements and modifying the focus position difference by a value substantially similar to a slope of the plurality of measurements.

2. The method of claim 1, wherein the modifying the focus position difference by the value substantially similar to the slope of the plurality of measurements includes dividing the focus position difference by the value substantially similar to the slope of the plurality of measurements.

3. A method comprising:
acquiring a plurality of measurements for a plurality of corresponding sites printed by a lithographic printing tool on a plurality of focus and exposure matrix (FEM) wafers, the plurality of FEM wafers including different predefined focus offsets; and
quantifying, with one or more processors, at least one inaccuracy of the lithographic printing tool by comparing the plurality of measurements across corresponding same sites on the plurality of FEM wafers, wherein the comparing the plurality of measurements includes determining a focus position difference between a set of measurements of the plurality of measurements and modifying the focus position difference by a value substantially similar to a slope of the plurality of measurements.

4. A system, comprising:
a lithographic printing tool configured to print a plurality of corresponding sites on a plurality of focus and exposure matrix (FEM) wafers, wherein the plurality of FEM wafers include different predefined focus offsets; and
one or more processors configured to execute a computer readable program stored on a non-transitory computer readable storage medium, wherein the computer readable program is configured to cause the one or more processors to:
acquire a plurality of measurements for the plurality of corresponding sites across the plurality of wafers; and
quantify a focus inaccuracy by comparing the plurality of measurements for the plurality of corresponding sites across the plurality of wafers, wherein the comparing the plurality of measurements includes determining a focus position difference between a set of measurements of the plurality of measurements and modifying the focus position difference by a value substantially similar to a slope of the plurality of measurements.

5. The method in claim 1, wherein the plurality of corresponding sites comprises a first plurality of corresponding sites for the plurality of wafers, wherein the plurality of measurements comprises a first plurality of measurements for the first plurality of corresponding sites.

6. The method in claim 5, wherein the plurality of wafers include at least a second plurality of corresponding sites.

7. The method in claim 6, further comprising:
acquiring at least a second plurality of measurements for the at least a second plurality of corresponding sites across the plurality of wafers.

8. The method in claim 7, further comprising:
quantifying, with the one or more processors, at least a second focus inaccuracy by comparing the at least a second plurality of measurements for the at least a second plurality of corresponding sites across the plurality of wafers, wherein the comparing the at least a second plurality of measurements includes determining at least a second focus position difference between a set of measurements of the at least a second plurality of measurements and modifying the at least a second focus position difference by a value substantially similar to a slope of the at least a second plurality of measurements.

9. The method in claim 8, wherein the modifying the at least a second focus position difference by a value substantially similar to a slope of the at least a second plurality of measurements includes dividing the at least a second focus position difference by the value substantially similar to the slope of the at least a second plurality of measurements.

10. The method in claim 9, where the slope of the at least a second plurality of measurements is determined by performing, with the one or more processors, a set of derivative calculations of the at least a second plurality of measurements with respect to the predefined focus offsets and averaging the set of derivative calculations of the at least a second plurality of measurements.

11. The method in claim 8, further comprising:
quantifying, with the one or more processors, a combined focus offset for the first plurality of corresponding sites and the at least a second plurality of corresponding sites by overlaying the first plurality of measurements with the at least a second plurality of measurements.

12. The method in claim 11, further comprising:
quantifying, with the one or more processors, a corrected focus value for a wafer of the plurality of wafers by overlaying the first plurality of measurements with the at least a second plurality of measurements.

13. The method in claim 2, wherein the slope of the plurality of measurements is determined by performing, with the one or more processors, a set of derivative calculations of the plurality of measurements with respect to the predefined focus offsets and averaging the set of derivative calculations of the plurality of measurements.

14. The method in claim 3, wherein the modifying the focus position difference by the value substantially similar to the slope of the plurality of measurements includes dividing the focus position difference by the value substantially similar to the slope of the plurality of measurements.

15. The method in claim 14, wherein the slope of the plurality of measurements is determined by performing, with the one or more processors, a set of derivative calculations of the plurality of measurements with respect to the predefined focus offsets and averaging the set of derivative calculations of the plurality of measurements.

16. The system in claim 4, wherein the modifying the focus position difference by the value substantially similar to the slope of the plurality of measurements includes dividing the focus position difference by the value substantially similar to the slope of the plurality of measurements.

17. The system in claim 16, wherein the slope of the plurality of measurements is determined by performing, with the one or more processors, a set of derivative calculations of the plurality of measurements with respect to the predefined focus offsets and averaging the set of derivative calculations of the plurality of measurements.

* * * * *